(12) United States Patent
Dai et al.

(10) Patent No.: US 12,278,116 B2
(45) Date of Patent: Apr. 15, 2025

(54) CHIP COOLER WITH HIGH PRESSURE BEARING CAPACITY

(71) Applicant: NINGBO HALLEY HEAT EXCHANGE EQUIPMENT CO., LTD, Zhejiang (CN)

(72) Inventors: Dingjun Dai, Zhejiang (CN); Hongqiang Zhuo, Zhejiang (CN); Xuguang Sun, Zhejiang (CN); Aibin Yan, Zhejiang (CN); Tinghui Chen, Zhejiang (CN)

(73) Assignee: NINGBO HALLEY HEAT EXCHANGE EQUIPMENT CO., LTD, Zhejiang (CN)

( * ) Notice: Subject to any disclaimer, the term of this patent is extended or adjusted under 35 U.S.C. 154(b) by 416 days.

(21) Appl. No.: 17/755,626

(22) PCT Filed: Jun. 4, 2021

(86) PCT No.: PCT/CN2021/098331
§ 371 (c)(1),
(2) Date: May 3, 2022

(87) PCT Pub. No.: WO2022/007563
PCT Pub. Date: Jan. 13, 2022

(65) Prior Publication Data
US 2022/0392776 A1    Dec. 8, 2022

(30) Foreign Application Priority Data
Jul. 9, 2020 (CN) .......................... 202021345114.7

(51) Int. Cl.
*H01L 21/48* (2006.01)
*G12B 15/00* (2006.01)
*H01L 23/473* (2006.01)

(52) U.S. Cl.
CPC .......... *H01L 21/4871* (2013.01); *G12B 15/00* (2013.01); *H01L 23/473* (2013.01)

(58) Field of Classification Search
CPC .... H01L 21/4871; H01L 23/473; G12B 15/00
(Continued)

(56) References Cited

U.S. PATENT DOCUMENTS 5,016,090 A * 5/1991 Galyon ............... H01L 23/4336
257/714
8,102,652 B2 * 1/2012 Toh ..................... H01L 23/4006
174/15.1
(Continued)

FOREIGN PATENT DOCUMENTS

CN        201936873 U    8/2011
CN        107611103 A    1/2018
(Continued)

*Primary Examiner* — Claire E Rojohn, III
(74) *Attorney, Agent, or Firm* — NKL Law; Allen Xue

(57) ABSTRACT

A chip cooler with high pressure bearing capacity installed on a chip it cools. The chip cooler has a cooler body having a refrigerant channel formed corresponding to the internal construction of the cooler body and configured to guide the flow of a refrigerant, and two liquid inlet and outlet channels formed corresponding to the construction at an edge of the cooler body, connected to the refrigerant channel and configured to transversely communicate the inside and outside of the cooler body; and a reinforced connecting piece is disposed in at least one of the two liquid inlet and outlet channels, the reinforced connecting piece at least connects opposite upper and lower wall surfaces of the liquid inlet and outlet channel, and a flow gap exists between the reinforced connecting piece and the liquid inlet and outlet channel.

6 Claims, 3 Drawing Sheets

(58) Field of Classification Search
USPC .................................................... 165/80.4
See application file for complete search history.

(56) References Cited

U.S. PATENT DOCUMENTS

| | | | | |
|---|---|---|---|---|
| 9,000,582 | B2* | 4/2015 | Hiramitsu | H01L 25/07 |
| | | | | 257/659 |
| D757,236 | S* | 5/2016 | Tokura | D23/323 |
| 9,704,779 | B2* | 7/2017 | Gohara | H01L 21/4882 |
| 9,960,100 | B2* | 5/2018 | Arai | H01L 25/18 |
| 2008/0237847 | A1* | 10/2008 | Nakanishi | F28F 3/12 |
| | | | | 257/722 |
| 2009/0008061 | A1* | 1/2009 | Inagaki | F28F 19/06 |
| | | | | 165/80.4 |
| 2010/0320753 | A1* | 12/2010 | Uneno | B21D 39/04 |
| | | | | 285/331 |
| 2011/0056661 | A1* | 3/2011 | Wojtowicz | H01L 23/467 |
| | | | | 165/135 |
| 2011/0073292 | A1* | 3/2011 | Datta | F28F 1/40 |
| | | | | 165/157 |
| 2011/0094722 | A1* | 4/2011 | Mori | H01L 23/473 |
| | | | | 165/181 |
| 2011/0188204 | A1* | 8/2011 | Horiuchi | H05K 7/20927 |
| | | | | 29/527.1 |
| 2011/0308059 | A1* | 12/2011 | Seo | B23P 15/26 |
| | | | | 29/428 |
| 2012/0103575 | A1* | 5/2012 | Tang | H01L 23/473 |
| | | | | 165/104.31 |
| 2013/0128643 | A1* | 5/2013 | Shinohara | H01L 24/36 |
| | | | | 363/131 |
| 2013/0153186 | A1* | 6/2013 | Gotou | H05K 7/20927 |
| | | | | 165/168 |
| 2013/0264702 | A1* | 10/2013 | Nishi | H01L 23/3735 |
| | | | | 257/712 |
| 2014/0239486 | A1* | 8/2014 | Gohara | H05K 7/20927 |
| | | | | 257/714 |
| 2016/0273842 | A1* | 9/2016 | Machler | B23P 15/26 |
| 2017/0187300 | A1* | 6/2017 | Shimazu | H02M 7/003 |
| 2017/0235350 | A1* | 8/2017 | Tsai | G06F 1/20 |
| | | | | 165/80.4 |
| 2019/0221499 | A1* | 7/2019 | Chang | F28D 9/0093 |
| 2020/0365419 | A1* | 11/2020 | Onishi | H01L 25/18 |
| 2022/0153085 | A1* | 5/2022 | Djallal | H01M 10/613 |
| 2022/0262701 | A1* | 8/2022 | Chen | H01L 21/563 |
| 2022/0392776 | A1* | 12/2022 | Dai | G12B 15/00 |
| 2022/0404100 | A1* | 12/2022 | Vanderwees | H01L 23/473 |
| 2023/0025258 | A1* | 1/2023 | Tsai | F04D 29/426 |

FOREIGN PATENT DOCUMENTS

| | | |
|---|---|---|
| CN | 208671747 U | 3/2019 |
| CN | 110520980 A | 11/2019 |
| CN | 210868300 U | 6/2020 |
| CN | 111769083 A | 10/2020 |
| CN | 212084986 U | 12/2020 |
| CN | 212084987 U | 12/2020 |

* cited by examiner

CHIP COOLER WITH HIGH PRESSURE BEARING CAPACITY

TECHNICAL FIELD

The utility model relates to the technical field of chip coolers, and in particular to a chip cooler with high pressure bearing capacity.

BACKGROUND

At present, drive module chips are mostly cooled by a refrigerant cooling device. The refrigerant cooling device includes a refrigerant channel for receiving a refrigerant and guiding the flow of the refrigerant. The heat of a chip is absorbed by the refrigerant, so that rapid cooling is achieved, and the chip is further prevented from being burnt due to overheating. The refrigerant channel of the current refrigerant cooling device is generally directly defined by a pipe body or defined by alignment of grooves in two heat-conducting plates. When the refrigerant channel is defined by the alignment of the grooves in the two heat-conducting plates, the hydraulic pressure of the liquid inlet and outlet of the refrigerant channel in abutting joint with a refrigerant pipe is maximum, and in the process of long-term use, the pressure-bearing fatigue of a plate surface of the lower heat-conducting plate corresponding to the liquid inlet and outlet is easily caused, thus resulting in deformation. The deformation of the heat-conducting plate will lead to the deformation or even damage of the chip connected with the heat-conducting plate. Therefore, room is left for improvement.

SUMMARY OF THE INVENTION

In order to overcome the defects in the prior art, the utility model provides a chip cooler with high pressure bearing capacity. Reinforced connecting pieces are disposed in liquid inlet and outlet channels, and the reinforced connecting pieces connect opposite upper and lower wall surfaces, so that the pressure bearing capacity of the liquid inlet and outlet channels is enhanced, the possibility of plate surface deformation at the liquid inlet and outlet channels is reduced, and the stable operation of a chip is effectively guaranteed.

To achieve the purposes, the utility model provides a chip cooler with high pressure bearing capacity, which is installed on a chip for cooling, including a cooler body, wherein the cooler body has a refrigerant channel formed corresponding to the internal construction of the cooler body and configured to guide the flow of a refrigerant, and two liquid inlet and outlet channels formed corresponding to construction at an edge of the cooler body, connected to the refrigerant channel and configured to transversely communicate the inside and outside of the cooler body;

a reinforced connecting piece is disposed in at least one of the two liquid inlet and outlet channels, the reinforced connecting piece at least connects opposite upper and lower wall surfaces of the liquid inlet and outlet channel, and a flow gap exists between the reinforced connecting piece and the liquid inlet and outlet channel.

Further, the cooler body at least includes an upper heat-conducting plate and a lower heat-conducting plate, and a lower surface of the lower heat-conducting plate is flatly attached to the chip;

communicating channels formed by the lower surface sinking to the upper surface through extrusion forming are correspondingly disposed in an interior of a plate body of the upper heat-conducting plate, and two upper notches formed by the lower surface sinking to the upper surface through extrusion forming, connected to the communicating channels and configured to transversely communicate the inside and outside of the plate body are correspondingly disposed at an edge of the plate body of the upper heat-conducting plate;

the lower surface of the upper heat-conducting plate is aligned with the upper surface of the lower heat-conducting plate in a sealing way, the communicating channels of the upper heat-conducting plate are matched with the plate surface of the lower heat-conducting plate to form the refrigerant channel, and the two upper notches of the upper heat-conducting plate are matched with the plate surface of the lower heat-conducting plate to form the two liquid inlet and outlet channels.

Further, lower flanging folded upward and matched with the end faces of the upper notches in a sealing way is disposed at an edge of the plate body of the lower heat-conducting plate at least corresponding to the upper notches of the upper heat-conducting plate, and mounting ports communicated with the upper notches are disposed at the lower flanging.

Further, sealing lips matched with the lower flanging are formed by correspondingly extending edges of the upper notches of the upper heat-conducting plate outward.

Further, each of the upper notches has an arc-shaped structure and is correspondingly disposed at an edge of the upper heat-conducting plate at the outer side of the chip;

arc-shaped lower notches opposite to the upper notches are disposed at an edge of the lower heat-conducting plate at the outer side of the chip, and the upper notches are matched with the lower notches in a sealing way to form the liquid inlet and outlet channels.

Further, a reinforced bulge formed by the lower surface sinking to the upper surface is disposed at a position of the lower heat-conducting plate corresponding to the communicating channels on the upper heat-conducting plate.

Further, the cooler body also includes at least one fitting plate stacked on the upper heat-conducting plate, and a refrigerant expansion cavity communicated with the refrigerant channel is formed between the fitting plate and the upper heat-conducting plate or between the adjacent fitting plates in a way of seal fit.

Further, the reinforced connecting piece is a line-shaped structure, a cross-shaped structure, or a ✳-shaped structure.

Compared with the prior art, the utility model is simple in structure, convenient to manufacture, and suitable for mass production. The refrigerant channel is formed by the alignment of the upper and lower heat-conducting plates, and the heat of the chip is effectively taken away by the refrigerant flowing in the refrigerant channel, which avoids the chip from being damaged due to overheating, and ensures the stable operation of the chip. Furthermore, the reinforced connecting pieces are disposed in the liquid inlet and outlet channels, and the reinforced connecting pieces connect the upper and lower wall surfaces of the liquid inlet and outlet channels so that the pressure bearing capacity of the liquid inlet and outlet channels is effectively enhanced, the formation of a convex or deformation at the position of the lower heat-conducting plate corresponding the liquid inlet and outlet channels can be effectively avoided, the possibility of damage to the chip due to the deformation of the lower heat-conducting plate is reduced, and the use stability of the chip is further effectively guaranteed.

Figure 1:
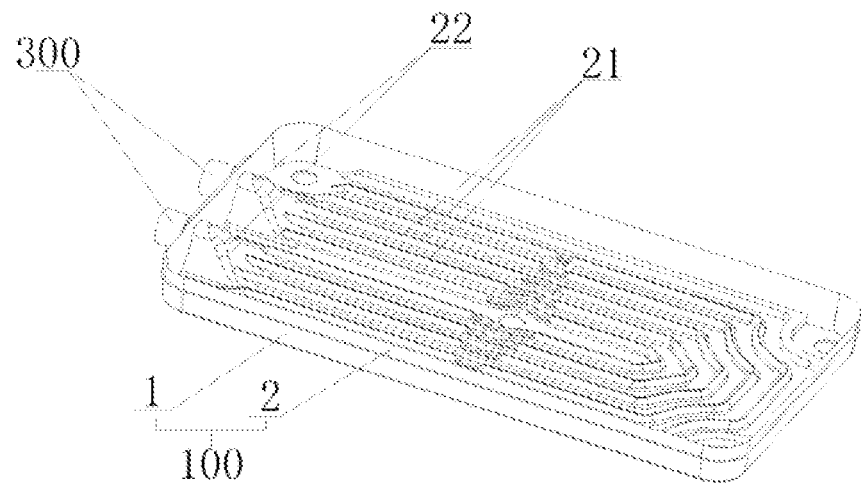
FIG. 1 is a perspective view of a chip cooler relating to embodiment I.

The following reference numerals on the drawings are described below:

100 denotes a cooler body; 1 denotes a lower heat-conducting plate; 11 denotes lower flanging; 111 denotes mounting ports; 12 denotes lower notches; 13 denotes a reinforced bulge; 2 denotes an upper heat-conducting plate; 21 denotes communicating channels; 22 denotes upper notches; 23 denotes upper flanging; 24 denotes communicating ports; 3 denotes fitting plates; 31 denotes fitting channels; and 32 denotes fitting notches.

200 denotes reinforced connecting pieces; and 300 denotes liquid inlet and outlet adapter tubes.

DETAILED DESCRIPTION OF THE INVENTION

A specific implementation of the utility model will be described in detail below with reference to the drawings, however it is to be understood that the protection scope of the utility model is not limited by the specific implementation.

Figure 3:
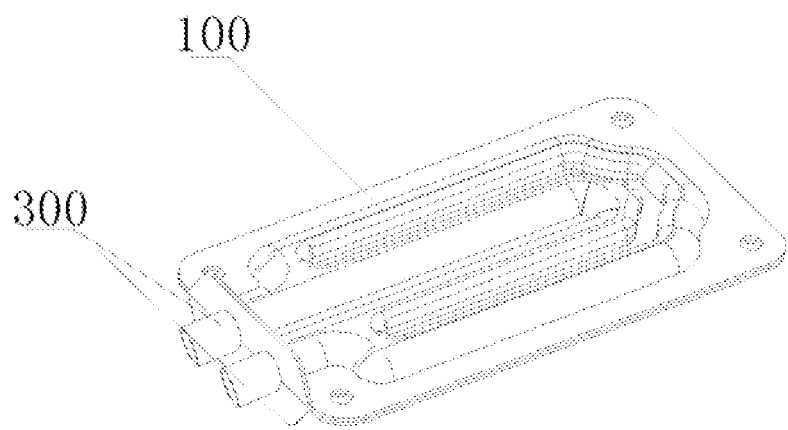
FIG. 3 is a perspective view of a chip cooler relating to embodiment II.

As shown in FIG. 1 and FIG. 3, the utility model relates to a chip cooler with high pressure bearing capacity. The chip cooler is used for heat dissipation of a chip by connecting with a refrigerant pipeline in series and directly attaching to the surface of the chip, and for instance, the chip cooler is applied to a chip of a variable-frequency air conditioner for heat dissipation. The refrigerant cooling device includes a cooler body 100, and two liquid inlet and outlet adapter tubes 300 connected with the cooler body 100. The cooler body 100 has a refrigerant channel formed corresponding to the internal construction of the cooler body and configured to guide the flow of a refrigerant, and two liquid inlet and outlet channels formed corresponding to the construction at an edge of the cooler body, connected to the refrigerant channel and configured to transversely communicate the inside and outside of the cooler body 100. The two liquid inlet and outlet channels may be provided either on the same side of the cooler body 100 or on different sides thereof. The two liquid inlet and outlet adapter tubes 300 are respectively communicated with the two liquid inlet and outlet channels. By connecting the liquid inlet and outlet adapter tubes 300 with the refrigerant pipeline in series, the refrigerant channel in the cooler body 100 can receive the refrigerant and guide the refrigerant to flow in the refrigerant channel in the cooler body 100, so that the heat of the chip can be quickly absorbed, and the chip is then cooled. Accordingly, the chip is enabled to be always within a lower temperature range, and would not be burnt due to overheating.

According to the above solution, in order to improve the pressure bearing capacity of the cooler body 100 at the position corresponding to the liquid inlet and outlet channels and avoid chip damage caused by the protrusion or deformation of the lower wall of the cooler body 100. Preferably, a reinforced connecting piece 200 is disposed in one of the two liquid inlet and outlet channels of the cooler body 100, a flow gap exists between the reinforced connecting piece 200 and the liquid inlet and outlet channel, and the reinforced connecting piece 200 at least connects the opposite upper and lower wall surfaces of the liquid inlet and outlet channel. Preferably, a reinforced connecting piece 200 is disposed in each of the two liquid inlet and outlet channels of the cooler body 100, and the reinforced connecting piece 200 is preferably a line-shaped structure, a cross-shaped structure, or a ✳-shaped structure.

Figure 2:
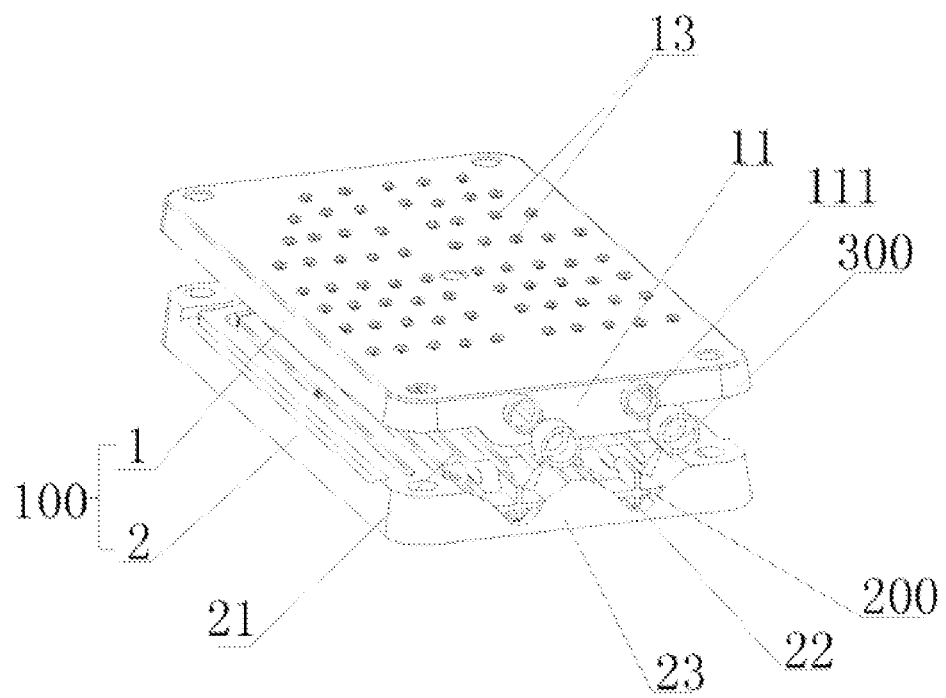
FIG. 2 is an exploded perspective view of the chip cooler relating to embodiment I.

Embodiment I: As shown in FIG. 1 and FIG. 2, the cooler body 100 is formed by the alignment of an upper heat-conducting plate 2 and a lower heat-conducting plate 1. Wherein the lower surface of the lower heat-conducting plate 1 is a flat end face and is attached to the surface of a chip. Preferably, the whole plate body of the lower heat-conducting plate 1 is positioned in the chip. Communicating channels 21 formed by the lower surface sinking to the upper surface through extrusion forming are disposed in the interior of the plate body of the upper heat-conducting plate 2. Two upper notches 22 formed by the lower surface sinking to the upper surface through extrusion forming, which are respectively connected to ports of the communicating channels 21, are disposed at the edge of the upper heat-conducting plate 2. The upper notches 22 are configured to transversely communicate the inside and outside of the plate body of the upper heat-conducting plate 2. Lower flanging 11 folded upward and matched with end faces of the edges of the upper notches 22 in a sealing way are disposed at an edge of the lower heat-conducting plate 1 at least corresponding to the two upper notches 22 of the upper heat-conducting plate 2. Mounting ports 111 are disposed at the lower flanging 11. The liquid inlet and outlet adapter tubes 300 are inserted into the mounting ports 111 of the lower flanging 11. Reinforced connecting pieces 200 are connected with the bottom walls of the upper notches 22 and the upper surface of the lower heat-conducting plate 1. Preferably, sealing lips are formed by correspondingly extending the edges of the upper notches 22 of the upper heat-conducting plate 2 outward. The sealing lips are matched with the lower flanging 11, so that the contact area is effectively enlarged, and the sealing effect of the edges of the upper notches 22 and the lower flanging 11 is improved.

According to the above solution, preferably, the lower flanging 11 arranged continuously or at intervals along the outer edge are disposed on the lower heat-conducting plate 1. An embedded mouth structure is formed by the collocation of the lower flanging 11 at the outer edge of the lower heat-conducting plate 1. The upper heat-conducting plate 2 is embedded in the embedded mouth formed by the lower heat-conducting plate 1, which effectively improves the positioning and matching effect of the upper and lower heat-conducting plates. Preferably, upper flanging 23 matched with the lower flanging 11 are disposed on the upper heat-conducting plate 2 along the outer edge. The sealing lips are part of the upper flanging 23, so that the seal fit effect of the upper heat-conducting plate 2 and the lower heat-conducting plate 1 can be improved.

Further, a reinforced bulge 13 formed by the lower surface sinking to the upper surface is disposed at a position of the lower heat-conducting plate 1 corresponding to the communicating channels 21 on the upper heat-conducting plate 2, thus enhancing the plate surface pressure bearing effect of the lower heat-conducting plate 1 at the refrigerant channel.

Figure 4:
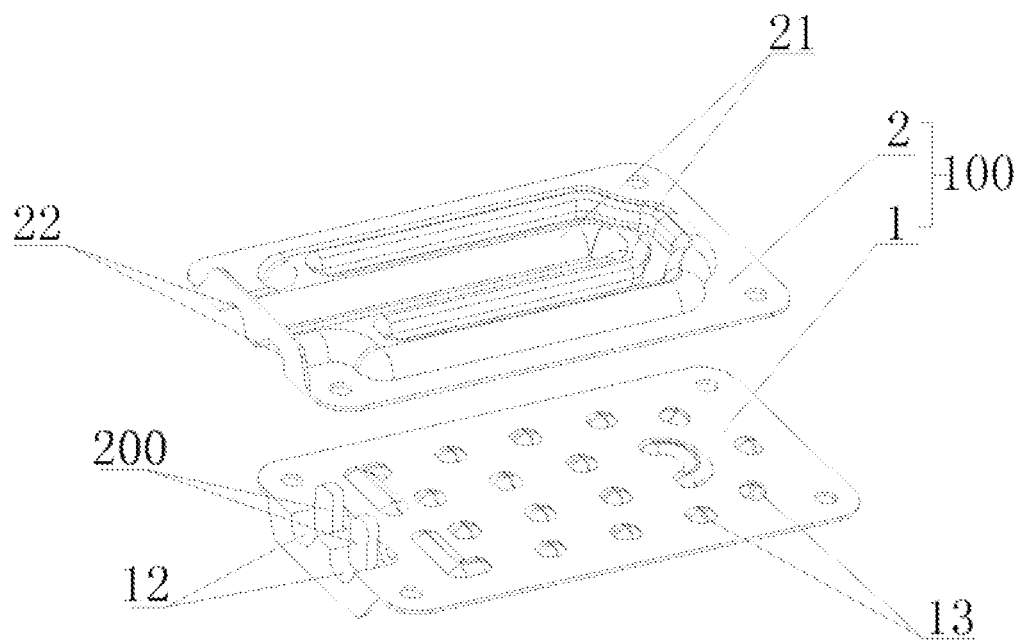
FIG. 4 is an exploded perspective view of the chip cooler relating to embodiment II.

Embodiment II: As shown in FIG. 3 and FIG. 4, compared with embodiment I, the arc-shaped upper notches 22 formed by the lower surface sinking to the upper surface through extrusion forming are disposed at an edge of the upper heat-conducting plate 2 at the outer side of the chip. The communicating channels 21 formed by the lower surface sinking to the upper surface through extrusion forming, which are connected to the two upper notches 22, are disposed on the plate surface of the upper heat-conducting plate 2. Arc-shaped lower notches 12 formed by the upper surface sinking to the lower surface through extrusion forming are disposed at the edge of the lower heat-conducting plate 1 at the outer side of the chip. The upper notches 22 and the lower notches 12 are arranged in a way of one-to-one correspondence. The upper heat-conducting plate 2 is aligned with the lower heat-conducting plate 1, and the communicating channels 21 are aligned with the plate surface of the lower heat-conducting plate 1, so that the refrigerant channel is formed. The upper notches 22 are aligned with the lower notches 12, so that the liquid inlet and outlet channels are formed. The liquid inlet and outlet adapter tubes 300 are inserted into the liquid inlet and outlet channels. The reinforced connecting pieces 200 are at least connected with the bottom wall of the upper notches 22 and the bottom wall of the lower notches 12.

Figure 5:
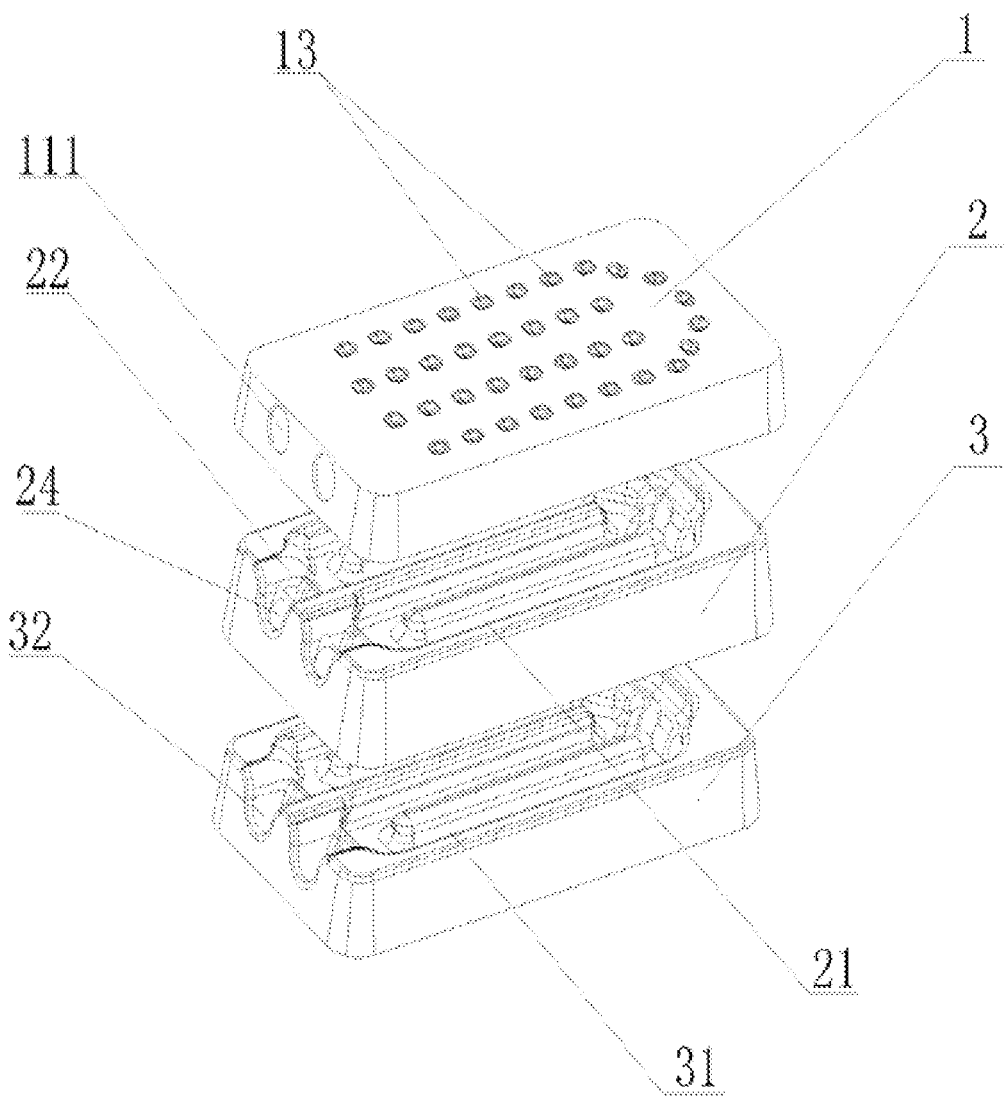
FIG. 5 is an exploded perspective view of a chip cooler relating to embodiment III.

Embodiment III: As shown in FIG. 5, compared with embodiment I and embodiment II, the chip cooler provided by embodiment III is provided with refrigerant expansion cavities expanded above the upper heat-conducting plate 2, so that the flow resistance and hydraulic pressure inside the chip cooler can be effectively reduced, and the stable operation of the chip cooler is further guaranteed. Specifically, at least one fitting plate 3 is stacked on the upper heat-conducting plate 2. The refrigerant expansion cavities communicated with the refrigerant channel in embodiment I or embodiment II are formed between the fitting plates 3 and the upper heat-conducting plate 2 which are adjacent to each other or between the adjacent fitting plates 3 in a way of seal fit. Preferably, fitting channels 31 and fitting notches 32 formed by extrusion forming, which are separately formed by sinking the lower surface to the upper surface and are respectively corresponding to the communicating channels 21 and the upper notches 22, are disposed on the plate surface of the fitting plate 3. The refrigerant expansion cavity is formed between the adjacent fitting channels 31 which are matched with each other. The fitting plates 3 located below are provided with communicating ports penetrating the plate body at the positions corresponding to the fitting notches 32. The refrigerant expansion cavities are formed between the communicating channels 21 and the fitting channels 31 which are matched with each other. The upper heat-conducting plate 2 is provided with communicating ports 24 penetrating the plate body at the positions corresponding to the upper notches 22.

Compared with the prior art, the utility model is simple in structure, convenient to manufacture, and suitable for mass production. The refrigerant channel is formed by the alignment of the upper and lower heat-conducting plates, and the heat of the chip is effectively taken away by the refrigerant flowing in the refrigerant channel, which avoids the chip from being damaged due to overheating, and ensures the stable operation of the chip. Furthermore, the reinforced connecting pieces are disposed in the liquid inlet and outlet channels, and the reinforced connecting pieces connect the opposite upper and lower wall surfaces of the liquid inlet and outlet channels, so that the pressure bearing capacity of the liquid inlet and outlet channels is effectively enhanced, the formation of a convex hull or deformation at the position of the lower heat-conducting plate corresponding the liquid inlet and outlet channels can be effectively avoided, the possibility of damage to the chip due to the deformation of the lower heat-conducting plate is reduced, and the use stability of the chip is further effectively guaranteed.

The above disclosure is only the embodiments of the utility model, but the utility model is not limited thereto, and any changes that can be conceived by those skilled in the art should fall within the protection scope of the utility model.

The invention claimed is:

1. A chip cooler, comprising: a cooler body having an upper heat-conducting plate and a lower heat-conducting plate,
   wherein the upper heat-conducting plate comprises a groove facing the lower heat-conducting plate so as to cooperatively form with the lower heat-conducting plate a refrigerant channel in an interior of the cooler body and configured to guide the flow of a refrigerant, and a liquid inlet channel and a liquid outlet channel at an edge of the cooler body,
   wherein a reinforced connecting piece is disposed in at least one of the liquid inlet channel and the liquid outlet channel, the reinforced connecting piece being a cross-shaped structure or a ✶-shaped structure, and
   wherein the reinforced connecting piece is in contact with the upper heat-conducting plate and the lower heat-conducting plate that form the upper wall and the lower wall, respectively, of the liquid inlet channel and the liquid outlet channel.

2. The chip cooler according to claim 1, wherein a lower surface of the lower heat-conducting plate is flat and configured to be attached to a chip.

3. The chip cooler according to claim 2, wherein the upper heat-conducting plate has two upper notches and the lower heat-conducting plate has a lower flanging that is folded upward and matched with end faces of the two upper notches in a sealing way and two mounting ports disposed at the lower flanging and each mounting port is in communication with one of the two upper notches.

4. The chip cooler according to claim 3, wherein each of the two upper notches has an arc-shaped structure and is correspondingly disposed at an edge of the upper heat-conducting plate; and
   the lower heating-conducting plate has two lower notches that are arc-shaped and disposed oppositely to the two upper notches and the two upper notches are matched with the two lower notches in a sealing way to form the liquid inlet channel and the outlet channel.

5. The chip cooler according to claim 2, wherein the lower heat-conducting plate has a plurality of reinforced bulges extending into the refrigerant channel.

6. The chip cooler according to claim 2, wherein the cooler body further comprises at least one fitting plate stacked on the upper heat-conducting plate to form a refrigerant expansion cavity that is in communication the refrigerant channel.

* * * * *